Figure 1A:
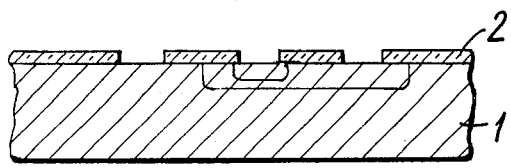

United States Patent [19]

Tsunemitsu et al.

[11] 3,939,047
[45] Feb. 17, 1976

[54] METHOD FOR FABRICATING ELECTRODE STRUCTURE FOR A SEMICONDUCTOR DEVICE HAVING A SHALLOW JUNCTION

[75] Inventors: Hideo Tsunemitsu; Hiroshi Shiba, both of Tokyo, Japan

[73] Assignee: Nippon Electric Co., Ltd., Tokyo, Japan

[22] Filed: Aug. 29, 1974

[21] Appl. No.: 501,633

Related U.S. Application Data

[62] Division of Ser. No. 305,673, Nov. 13, 1972, Pat. No. 3,848,260.

[30] Foreign Application Priority Data

Nov. 15, 1971 Japan.............................. 46-91405

[52] U.S. Cl.................................... 204/15; 357/71
[51] Int. Cl.²................. C25D 5/02; H01L 23/48
[58] Field of Search...................... 204/15; 117/212; 317/234 R, 5.3; 357/71

[56] References Cited
UNITED STATES PATENTS

| | | | |
|---|---|---|---|
| 3,442,701 | 5/1969 | Lepselter | 117/212 |
| 3,634,203 | 1/1972 | McMahon | 317/234 |
| 3,663,279 | 5/1972 | Lepselter | 117/212 |
| 3,672,984 | 6/1972 | Sato et al. | 117/212 |
| 3,741,880 | 6/1973 | Shiba et al. | 29/577 |
| 3,798,135 | 3/1974 | Bracken et al. | 204/15 |
| 3,827,949 | 8/1974 | Platter et al. | 317/234 R |

*Primary Examiner*—T. M. Tufariello
*Attorney, Agent, or Firm*—Hopgood, Calimafde, Kalil, Blaustein & Lieberman

[57] ABSTRACT

A thermally stable semiconductor device is disclosed in which a thin aluminum film is formed over a silicon oxide film selectively formed on the silicon substrate. A layer of a metal such as tantalum, tungsten, or molybdenum that does not enter into an alloy reaction with silicon at heat treatment temperatures is formed over the thin aluminum film and is covered with a thick aluminum film. Oxides of the upper thick aluminum layer as well as oxides of the non-alloying metal and the lower aluminum layer are selectively formed in alignment with one another at locations where the electrodes are not formed.

13 Claims, 7 Drawing Figures

METHOD FOR FABRICATING ELECTRODE STRUCTURE FOR A SEMICONDUCTOR DEVICE HAVING A SHALLOW JUNCTION

This is a division of application Ser. No. 305,673 filed Nov. 13, 1972, now U.S. Pat. No. 3,848,260.

This invention relates to a semiconductor device, and more particularly to an electrode structure for a semiconductor device having a shallow junction.

Aluminum has heretofore been generally used as the electrode material in semiconductor devices. However, aluminum may enter into an alloying reaction with semiconductor material at a relatively low temperature. Therefore, in the formation of semiconductor devices such as ultra-high frequency amplifying transistors and ultra-high speed switching transistors having an extremely shallow P-N junction, the alloying reaction region could easily reach the P-N junction, to thereby destroy that junction. As a result, conventional semiconductor devices, particularly those devices having shallow P-N junctions, that employ aluminum electrodes are often thermally unstable.

It is an object of this invention to provide a thermally stable semiconductor device.

It is a further object of this invention to provide a thermally stable semiconductor device of the type having a shallow junction.

It is another object of the invention to provide an improved electrode structure for a shallow-junction semiconductor device.

It is yet another object of this invention to provide a novel and non-complicated method of producing a highly reliable shallow-junction semiconductor device.

According to this invention, the electrodes of a semiconductor device are comprised of an extremely thin aluminum layer that can maintain a good ohmic contact with the semiconductor substrate material. A metallic barrier layer formed of tantalum, tungsten, or molybdenum overlies the thin aluminum layer, and a conductive layer of aluminum is formed on the barrier layer. In this electrode structure, ohmic contact between the electrode and the semiconductor is obtained by heating the semiconductor substrate at a temperature near the alloying temperature of silicon and aluminum. The alloying temperature of aluminum with silicon is 575°C, whereas the alloying temperatures of tantalum, tungsten, and molybdenum with silicon are respectively 2400°C, 2150°C and 1870°C, each of which is much higher than the aluminum-silicon alloying temperature. Hence, by heating the silicon substrate at a temperature near the aluminum-silicon alloying temperature, only the aluminum thin layer is brought into reaction with the silicon substrate to form aluminum silicide and thereby establish good ohmic contact. The depth of the thus-formed aluminum silicide layer depends upon the heating temperature and the thickness of the thin aluminum layer. Therefore, the thickness of the aluminum thin layer may be adjusted in advance according to the depth of the junction, and it is thus possible to avoid the destruction of the shallow junction even if the semiconductor is subjected to heat treatment for a long period of time. In other words, the thickness of the lowermost aluminum thin layer is selected so that the aluminum silicide layer formed by the reaction of the thin aluminum layer with the silicon substrate does not reach the shallowest P-N junction in the substrate under any heat treatment that the silicon substrate may be subjected to.

For example, where ohmic contact is to be established between the thin aluminum layer and the silicon substrate by heating the silicon substrate at a temperature of between 400°C and 500°C, and where the depth of the shallowest P-N junction in the silicon substrate is between 0.2 and 0.8 microns, the thickness of the thin aluminum layer should be less than 0.01 to 0.05 microns according to the junction depth. It is thus possible according to this feature of the invention to prevent the destruction of the junction during the heat treatment in which the ohmic contact is formed, as well as during the subsequent heat treatment to which the semiconductor is subjected. In general, the temperature of the subsequent heat treatment does not exceed 500°C. The tantalum, tungsten, or molybdenum layer on the aluminum thin layer must be of sufficient thickness to enable that layer to act as a barrier against the aluminum conductive layer formed thereon. When a selective anodic oxidation process is employed, the thickness of the tantalum, tungsten, or molybdenum barrier layer is preferably about 0.1 micron for convenience in fabrication.

According to another aspect of this invention, selective anodic oxidation rather than the conventional selective etching process is employed to form the electrodes. Therefore, when the electrodes are simultaneously formed, the surface of the semiconductor substrate is perfectly covered with layers of chemically and electrically stable metal oxides. As a result, the junction formed in the semiconductor substrate is sufficiently protected from external corrosion and high reliability can thus be obtained.

The other objects, features, and advantages of the invention will become more apparent from the following description taken in conjunction with the accompanying drawings in which common elements are indicated by identical reference numerals.

Figure 1B:
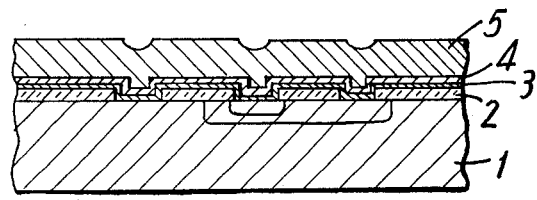
Figure 1C:
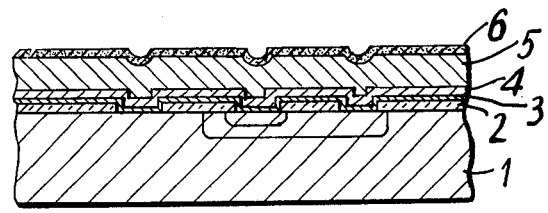
Figure 1D:
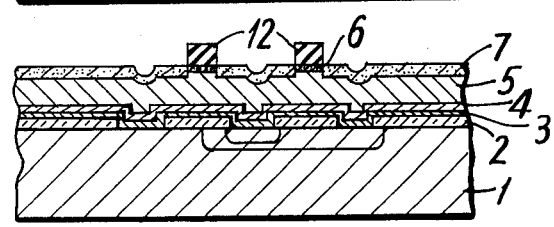
Figure 1E:
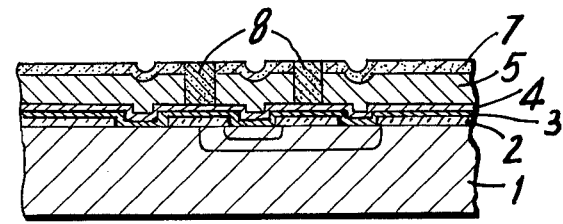
Figure 1F:
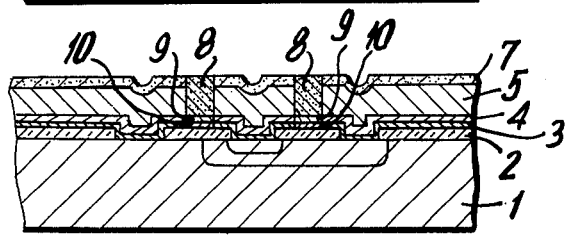
Figure 1G:
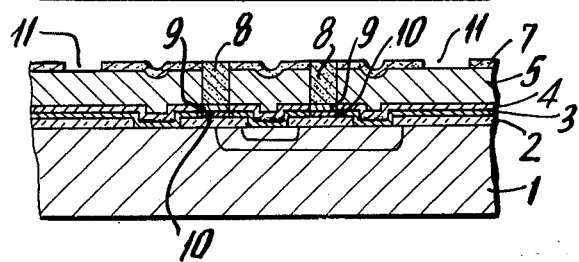

FIGS. 1 a through 1 g are cross-sectional views of a semiconductor element according to an embodiment of the invention in respective steps of production.

Referring to the figures, there is illustrated the sequence of steps employed in fabricating a semiconductor device according to an embodiment of this invention. Both the device and the method for its fabrication, which includes a series of selective oxidation steps, are considered to constitute the invention.

A silicon substrate 1 having the necessary P-N junctions is initially prepared. The surface of the substrate is covered as shown in FIG. 1 a with a silicon oxide film 2 except at the locations of openings from which electrodes are to be led out. A thin aluminum film 3 of approximately 0.01 micron in thickness is uniformly deposited over the surface of silicon oxide film 2. A relatively thick film 4 of approximately 0.1 micron in thickness and of a metal that barely reacts with the silicon material of the substrate is deposited over aluminum film 3 by evaporation. Film 4 may be advantageously formed of tantalum, tungsten, or molybdenum, and is hereinafter described as being tantalum. A 1.5 micron thick aluminum film 5 is then deposited on tantalum film 4, also by evaporation as shown in FIG. 1 b.

A first anodization process is carried out on the entire surface of thick aluminum film 5 to form a porous aluminum oxide film 6 of approximately 0.1 micron in thickness as shown in FIG. 1 c. Porous aluminum oxide film 6 is effective to increase the adhesiveness of the photoresist in the subsequent second anodization process. For forming the porous aluminum oxide film 6, anodization may be performed by using 10% chromic acid in aqueous solution at a constant forming voltage of 10V for 10 minutes.

After the formation of porous oxide film 6, a photoresist is applied to the surface of the porous aluminum oxide film, and areas other than those at which electrodes are to be formed are covered with a photoresist 12. Using photoresist 12 as a mask, a second anodization process is performed whereby a composite aluminum oxide film 7 is formed in the area of aluminum oxide film 6 where photoresist 12 does not cover the porous aluminum oxide film 6 as shown in FIG. 1 d. For carrying out this sedond anodization process, a forming solution of ethylene glycol saturated with ammonium borate can be used. The anodization can be performed at a constant forming voltage of 80V applied for a period of 15 minutes. The composite aluminum oxide film 7 consists of a thin non-porous aluminum oxide film formed in the interface between the remaining aluminum film 5 and the former porous aluminum oxide film 6, and an aluminum oxide film which is the former porous aluminum oxide film 6 but has a quasi non-porous property. Thereafter, photoresist 12 is removed, and a third anodization process is carried out using the composite aluminum oxide film 7 as a mask. As a result of this process, the part of the remaining aluminum film 5 that is covered with only the porous aluminum oxide film 6, is converted into a porous aluminum oxide film 8 throughout its entire thickness as shown by FIG. 1 e. The third anodization process is desirably carried out by using 10% dilute sulfuric acid at a constant forming voltage of 10 V.

In one manner of carrying out the method herein described, the portion of aluminum film 5 not masked with the composite aluminum film 7 was converted into porous aluminum oxide by carrying out the third anodization process for about 15 minutes. In the third anodization process, tantalum film 4 is practically free of oxidation. A fourth anodization process is thereafter performed in order to anodically oxidize the tantalum film 4 to its entire thickness. In this process the remaining aluminum film 5 covered with the composite aluminum oxide film 7 is used as a mask, and unmasked portions of the tantalum film 4 and aluminum thin film 3 underlying the porous oxide film 8 are anodically oxidized and thereby respectively converted into a tantalum oxide film 9 and an aluminum oxide film 10, which, as shown in FIG. 1 f, are in substantial alignment with one another. For this fourth anodization process, a 3% ammonium citrate in aqueous solution is advantageously used at a constant forming voltage of 200V applied for a period of 15 minutes.

The semiconductor substrate is thereafter subjected to heat treatment at a temperature of about 450°C for 1 hour. As a result of the heat treatment process, good ohmic contact is established between the electrodes and the semiconductor and, at the same time, the aluminum oxide and tantalum oxide films formed by the anodic oxidation processes are chemically stabilized. As the final step in the process, openings 11 to the semiconductor device are formed in the desired portions of the aluminum oxide film 7 covering the electrode for installing external leads or wiring layers. The electrode structure fabricated according to the method hereinabove described is illustrated in FIG. 1 g.

In the semiconductor device of the invention, the amount of aluminum that is involved in an alloying reaction with the silicon substrate is controlled to be very accurate and low, thereby to markedly increase the stability of the device against heat treatment. When a conventional aluminum electrode is applied to a silicon semiconductor element having a washed-emitter structure of a 0.3 micron junction depth, the emitter junction is short-circuited by the heat treatment at a temperature of 300°C for about 30 minutes, or at a temperature of 400°C for about 5 minutes. Whereas, according to the above-described embodiment of the invention, no deterioration of the junction was observed by a heat treatment at a temperature of 400°C for 20 hours, or at a temperature of 500°C for 5 hours.

As has been described above, the semiconductor device of the invention is essentially featured by employing a laminated electrode structure having a first thin layer of metal capable of forming a good ohmic contact with the semiconductor and having a controlled thickness, a second layer of a metal reacting with the semiconductor at an extremely high temperature overlying the first layer, and a third layer of a metal having a good electrical conductivity overlying the second layer. Another important feature of the invention is the use of a series of anodic oxidation processes to form electrodes of a predetermined pattern. One significant advantage of this invention is the provision of a thermally stable electrode for the semiconductor device. Furthermore, the invention makes it readily possible to realize a semiconductor device in which the semiconductor surface is perfectly protected by electrically and chemically stable metal oxides.

Although only a single specific embodiment of the invention has been herein illustrated and described in detail, it is to be understood that the invention is not limited thereto or thereby.

What is claimed is:

1. A method of fabricating a semiconductor device comprising the steps of providing a semiconductor substrate, forming an insulating film over the upper surface of said substrate except for predetermined portions thereof, successively forming first, second, and third metal layers on said substrate and said insulating film, said first metal layer being capable of being alloyed with said semiconductor substrate at a first temperature, said first metal layer having a thickness less than the depth of the shallowest junction in the substrate, said second metal layer being capable of being alloyed with said substrate at a second temperature higher than said first temperature, said third metal layer having a good electric conductivity and being thicker than any of said first and second metal layers, anodically oxidizing said third metal layer to convert the selected portion thereof into an insulator to the surface of said second metal layer, anodically oxidizing those portions of said second and first metal layers which are aligned with said selected portion of said third metal layer, and thereafter performing heat treatment for alloying a portion of said first metal layer with said substrate at a temperature below said second temperature.

2. The method of claim 1, in which said first and third layers are aluminum and said second layer is formed of a metal selected from the group consisting of tantalum, tungsten, and molybdenum.

3. The method of claim 1, in which said step of anodically oxidizing said third metal layer comprises the steps of performing a first anodization process to oxidize the upper portion of said third layer to form a porous metal oxide film, applying a mask to a selected portion of said porous oxide film, and performing a second anodization process using said mask to form a composite metal oxide film in the area of said porous oxide film not covered by said mask.

4. The method of claim 3, in which said step of anodically oxidizing said third metal layer further comprises the step of performing a third anodization process to convert the portion of said third layer not masked by said composite oxide film into a porous oxide film throughout the entire thickness of said third layer.

5. The method of claim 4, in which said step of anodically oxidizing said third metal layer further comprises the step of performing a fourth anodization process employing the remaining portion of said third layer covered with said composite oxide film as a mask to anodically oxide the portions of said second and first layers underlying said porous oxide film of said third layer metal.

6. The method of claim 5, in which said first and third layers are aluminum and said second layer is formed of a metal selected from the group consisting of tantalum, tungsten, and molybdenum.

7. The method of claim 1, in which said first metal layer is aluminum and said second metal layer is tantalum, and in which said first and second metal layers are anodically oxidized by using an aqueous ammonium citrate solution as a forming solution.

8. A method of fabricating a semiconductor device comprising the steps of providing a semiconductor substrate, forming an insulating film over the upper surface of said substrate except for predetermined portions thereof, forming a first aluminum layer on said substrate and said insulating film, forming a tantalum layer of a substantially uniform thickness on said first aluminum layer, forming a second aluminum layer of a thickness greater than that of either of said first aluminum layer and said tantalum layer on said tantalum layer, carrying out an anodic oxidation treatment to convert selectively aligned portions of said first aluminum layer, said tantalum layer and said aluminum layer into an insulator region, and performing heat treatment for alloying a portion of said first aluminum layer with said semiconductor substrate.

9. The method of claim 8, in which said first aluminum layer has a thickness less than the depth of the shallowest junction in the substrate and said second aluminum layer is thicker than any of said first aluminum layer and said tantalum layer, and in which said step of carrying out anodic oxidation includes the steps of anodically oxidizing said second aluminum layer to convert the selected portion thereof into an insulator to the surface of said tantalum layer and anodically oxidizing those portions of said tantalum layer and said first aluminum layer which are aligned with said selected portion of said second aluminum layer.

10. The method of claim 8, in which said step of carrying out anodic oxidation comprises the steps of performing a first anodization process to oxidize the upper portion of said second aluminum layer to form a porous aluminum oxide film, applying a mask to a selected portion of said porous oxide film, and performing a second anodization to form a composite metal oxide film in the area of said porous oxide film not covered by said mask.

11. The method of claim 10, in which said step of carrying out anodic oxidation further comprises the step of anodically oxidizing the portion of said second aluminum layer not masked by said composite oxide film to a porous oxide film throughout substantially the entire thickness of said second aluminum layer.

12. The method of claim 11, in which said step of carrying out anodic oxidation further comprises the step of anodically oxidizing the portions of said tantalum layer and said first aluminum layer underlying said porous oxide film of said second aluminum layer employing the remaining portion of said second aluminum layer covered with said composite oxide film as a mask.

13. The method of claim 9, in which said first aluminum layer and said tantalum layer are anodically oxidized by using an aqueous ammonium citrate solution as a forming solution.

* * * * *

UNITED STATES PATENT OFFICE
CERTIFICATE OF CORRECTION

Patent No. 3,939,047      Dated February 17, 1976

Inventor(s) Hideo Tsunemitsu et al.

It is certified that error appears in the above-identified patent and that said Letters Patent are hereby corrected as shown below:

Claim 8, line 43, before "aluminum" insert --second--;

Claim 10, line 23, after "anodization" insert --process--.

Signed and Sealed this fourth Day of May 1976

[SEAL]

Attest:

RUTH C. MASON
*Attesting Officer*

C. MARSHALL DANN
*Commissioner of Patents and Trademarks*